United States Patent [19]

Casanova et al.

[11] Patent Number: 4,922,125
[45] Date of Patent: May 1, 1990

[54] SYSTEM CABLE ASSEMBLY AND COMPONENT PACKAGING

[75] Inventors: Wayne J. Casanova; Roger F. Dimmick; William A. Hall; Lester C. Homan; Frank J. Lukes, all of Rochester; Bradley L. Martin, Byron; Claude J. Mosley; Arthur P. Reckinger, Jr., both of Rochester; Paul W. Schaefer; Zanti D. Squillace, both of Rochester; Gordon W. Westphal; Stephen E. Wheeler, both of Rochester, all of Minn.

[73] Assignee: International Business Machines Corporation, Armonk, N.Y.

[21] Appl. No.: 169,515

[22] Filed: Mar. 17, 1988

[51] Int. Cl.⁵ .............................................. H02B 1/20
[52] U.S. Cl. ..................................... 307/149; 361/428; 361/415; 361/390; 361/391; 307/147; 307/148
[58] Field of Search ....................... 307/147, 148, 149; 361/331–334, 343, 352, 375, 376, 399, 404, 405, 406, 408, 412–420, 428, 427, 429; 439/59

[56] References Cited

U.S. PATENT DOCUMENTS

| | | | |
|---|---|---|---|
| 3,691,430 | 9/1972 | Freitag | 361/415 |
| 3,853,379 | 12/1974 | Goodman et al. | 361/415 X |
| 4,145,620 | 3/1979 | Dice | 307/149 |
| 4,151,580 | 4/1979 | Struger et al. | 361/415 |
| 4,152,750 | 5/1979 | Bremenour et al. | 361/415 X |
| 4,233,646 | 11/1980 | Leung et al. | 361/399 |
| 4,301,494 | 11/1981 | Jordan | 361/415 |
| 4,514,786 | 4/1985 | Charruau | 361/91 X |
| 4,564,250 | 1/1986 | Klein et al. | 361/412 X |
| 4,609,829 | 9/1986 | Milby et al. | 307/149 X |
| 4,628,413 | 12/1986 | Speraw | 361/399 X |
| 4,648,009 | 3/1987 | Beun et al. | 361/412 X |
| 4,675,538 | 6/1987 | Epstein | 307/64 |
| 4,679,123 | 7/1987 | Young | 361/428 |
| 4,694,380 | 9/1987 | Mallory et al. | 361/413 X |
| 4,702,535 | 10/1987 | Beun | 361/415 X |
| 4,704,599 | 11/1987 | Kimmel et al. | 307/140 X |
| 4,754,397 | 6/1988 | Varaiya et al. | 364/200 |
| 4,780,792 | 10/1988 | Harris et al. | 361/395 |

Primary Examiner—William M. Shoop, Jr.
Assistant Examiner—Paul Ip
Attorney, Agent, or Firm—Robert W. Lahtinen

[57] ABSTRACT

A data processing system is shown packaged in an enclosure wherein the system frame or chassis and a cable carrier are separately fabricated and thereafter merged to provide an enclosure with open ends and a central cable carrier that mounts connections for the system components. The system components are slideably received by the enclosure and are self docking as the electrical connections with the system power and signal lines are completed as the components arrive at the fully inserted, latched position. Keying means are also provided to require the user to install the components at both the correct location and with the correct orientation.

12 Claims, 7 Drawing Sheets

SYSTEM CABLE ASSEMBLY AND COMPONENT PACKAGING

FIELD OF THE INVENTION

This invention relates to mechanical and electrical packaging and more particularly to the packaging of a multiple component system such as a computing system to facilitate manufacture, reliability and easy of use and maintenance.

BACKGROUND OF THE INVENTION

Existing systems are usually constructed by assembling components within an enclosure that requires sequential assembly of cabling and connectors to interconnect the individual components or subassemblies. This involves sequential assembly or disassembly even when the major components are modular in nature and assembled as units.

Conventionally assembly usually results in poor access to cables and connectors causing difficult assembly into the system frame. Cable routing problems with complex discrete cables can result in misplugged connectors, cable damage and similar quality problems. EMC and operational reliability can vary dramatically if cable routing differs from system to system. Difficult access gives rise to more costly assembly and rework. Cable testing is rendered difficult by the complexity of separate cables and loose ends.

SUMMARY OF THE INVENTION

The system packaging of the present invention utilizes a central cable carrier that is separately fabricated and assembled with the cabling and connectors for the system components. The enclosure frame and shell is constructed and provided with mounting means for receiving and securing the cable carrier. Separate fabrication of the cable carrier assembly rather than assembly of cables to the interior recesses of the enclosure frame structure, makes common cable routing in each system easier. Simultaneous manufacture of the enclosure and cable carrier assembly is followed by the merger of the assemblies.

This packaging system also places the electrical power and signal connections to the components at the rear of the installed position of each component requiring blind connection. The system can thus be made user friendly by the packaging designer through the use of effective self guiding structures and self docking electrical connections. Self docking or automatic mechanical and electrical connection of a system component upon insertion along a designated and defined path is further described in an application assigned to the same assignee and filed concurrently with the present application, W. D. Corfits et al, Ser. No. 169,638, filed Mar. 17, 1988, entitled, "Three Stage Self Alignment Structure and Method". By keying the components to prevent installation at the wrong position or with the wrong orientation, the user is not required or able to make an installation decision that will cause electrical or mechanical damage to the component or to the overall system. It eliminates uncertainties that can lead to user dissatisfaction.

Also, in an environment that requires increasing reliability and the use of depot maintenance and repair rather than resident or on site service, it is equally necessary that the user or customer be able to readily and easily remove a component from the system. Without this ability of easy removal, the various self diagnostic tools and programs that identify and isolate problems to a particular system component are not as useful to the user.

DETAILED DESCRIPTION

Figure 1:
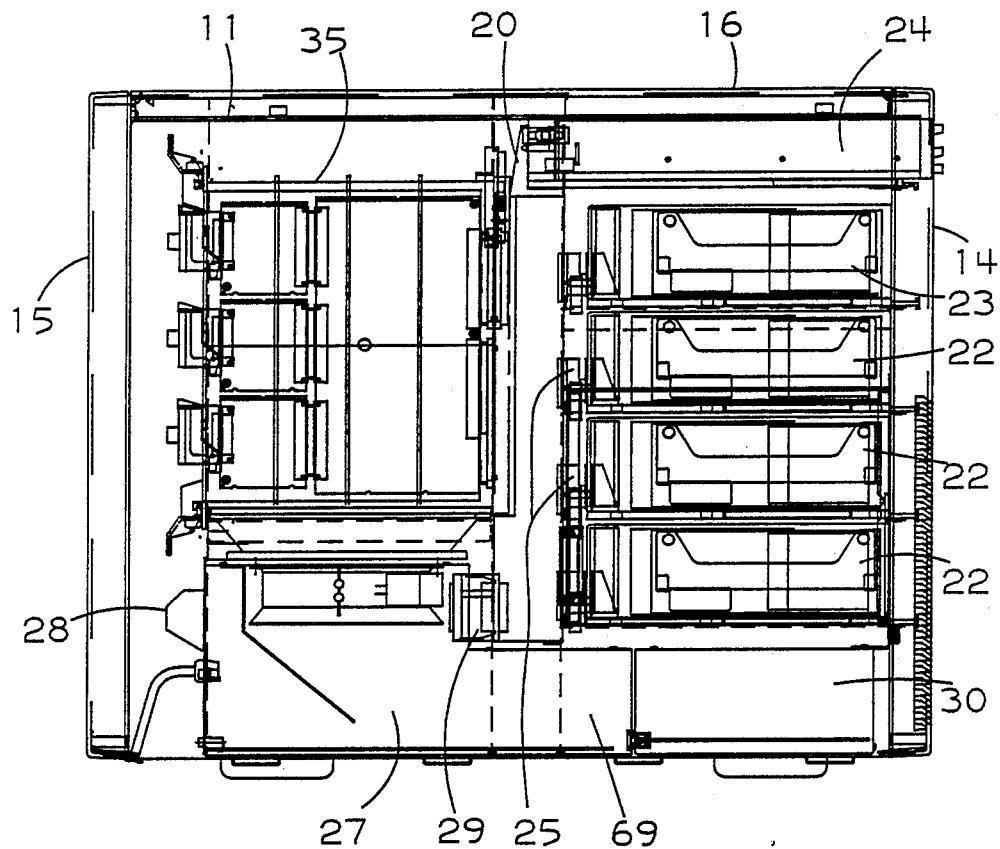
FIG. 1 is a broken away side elevation of a system enclosure illustrating the cable carrier and enclosure chassis and cover structure with the self docking components as taught by the present invention.

This invention is directed to the internal packaging of components and subassemblies of a system such as the components of a computer system within an enclosure. A cut-away side view of the chassis and cover structure forming the enclosure and the mounted system components is shown in FIG. 1. A formed and welded sheet metal chassis 11 with side panels 12, 13 (FIGS. 3, 4) front and rear covers 14, 15 respectively and top cover 16 contain and support the system components and subassemblies. The system may include multiple direct access storage devices or disk drives (DASD); tape and diskette drives; power supplies; logic books (circuit cards) and a battery back-up. The logic books may be single units of a base logic book card with daughter cards, as illustrated in FIG. 1 wherein three such cards are mounted at the outside edge surface. In the alternative, the base book may occupy the entire slot in the logic cage or two such auxiliary daughter cards may occupy the full height of the remaining available space in the book. The packaging system uses a central cabling carrier 20 which occupies the central portion of the enclosure space and provides connectors with respect to which many of the components are self docking. Guiding structures are provided that self align the components to enable a blind electrical connection to be made at the rear of the component as it slides into the latched, mounted position within the enclosure. As shown in FIG. 1, there are three DASD devices 22, an optional fourth DASD in the position 23 that may be used for a tape drive and a diskette drive 24, each of which are slideably received and are self guided to provide completed electrical signal and power connections at the connector blocks 25 in the inserted latched position. The AC power supply 27 is likewise self docking when inserted at the rear of the enclosure using handle 28 to connect to the connector blocks 29. The AC power supply 27 is connected to the AC input of the system and has as its output the DC power levels required by the system. The cooperating DC feature power supply 30 is inserted through a lower opening in the front of the enclosure and is self docking with respect to connectors carried by the inwardly facing end wall of the AC power supply 27.

Figure 2:
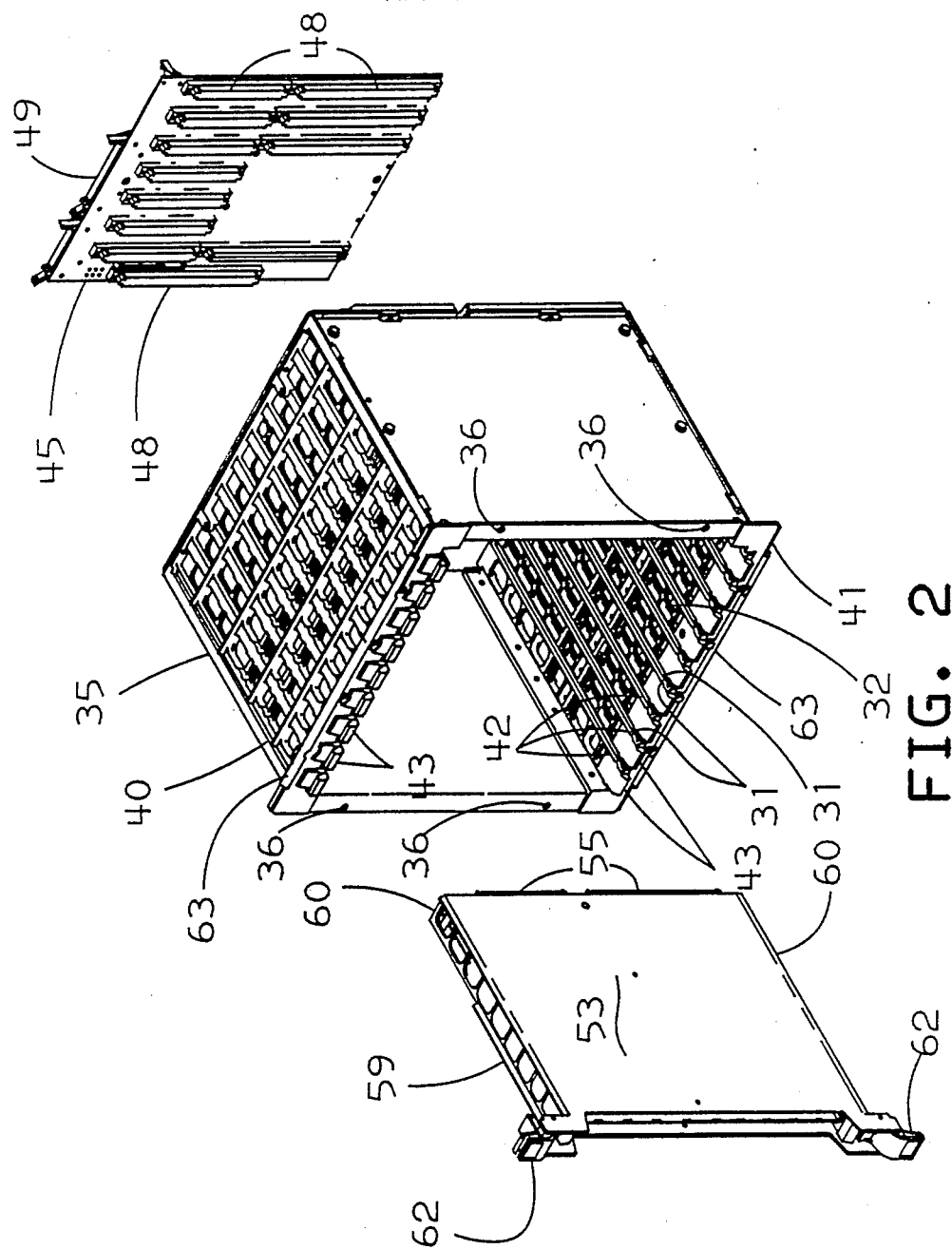
FIG. 2 is an illustration of the logic cage and cooperating logic book structure shown in the system of FIG. 1.
Figure 3:
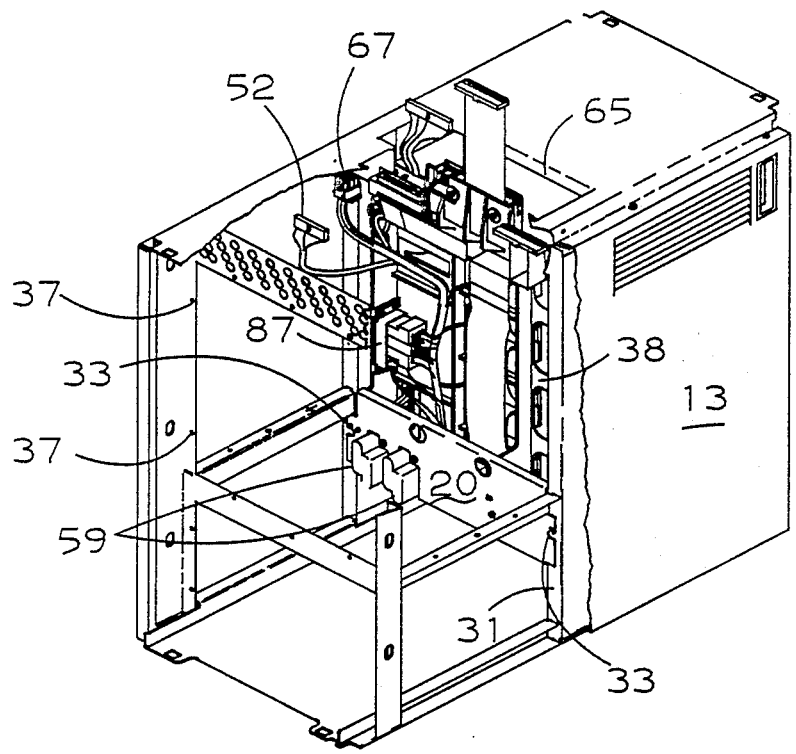
FIG. 3 is an isometric view of the enclosed system of FIG. 1 with end covers, top cover, logic cage and AC power supply unit removed.

At the upper rear portion of the enclosure frame 11, a logic cage 35 (shown in FIG. 2) is received and secured to the frame by bolts that extend through cage apertures 36 and corresponding frame apertures 37 (FIG. 3). The upper casting 40 and lower casting 41 have guideways 42 and latching structures 43 formed integrally therewith. The rear wall 45 of logic cage 35 has connectors 48 mounted thereon and communicates with the balance of the system through connectors 49 which attach to the cable carrier cable terminations 52. A series of logic books or enclosures 53 carry the circuit cards. Each of these logic books 53 is self docking such that the power and signal connections at the book rear wall connector 55 are completed when the book is inserted into the logic cage to the latched position. Rails 59, 60 at the top and bottom of the book 53 are received in cage guide grooves or ways 42 to bring the card to alignment with the corresponding rear wall connectors 48. The pivoting latches 62 on the book provide initial latching by engaging the cage latch projections 43 and finally locking into place when the upper latch portion overrides and is received behind the cage crossbar 63. Various keying techniques are also used to assure proper orientation of the books and insertion of a book at a slot having the correct cooperating connector 48 at the rear wall 45. For example, the foreshortened rail 59 at the top of book 53 prevents insertion in the inverted position.

The design of the system has provided for easy user installation of the system itself and its individual major components. Power supplies, DASD, internal tape, diskette drive and main and daughter and logic cards are all self guided and automatically connected (docked) to their respective power and signal connectors when inserted in the correct position. No tools are required for installation of these components. The optional battery backup and feature power supply also self dock to the system cabling and are designed for user installation. A wide range of features can also be installed by user set up without the intervention of service personnel.

FIG. 3 illustrates the enclosure with the top and rear covers removed and the side panel 13 partially broken away. The cable carrier is inserted through the upper rear wall opening of the enclosure prior to installation of the logic cage 35 at that location. The enclosure chassis 11 is formed of heavy gage sheet metal that is stamped, formed and welded. In conjunction with the side covers 12, 13 and top cover 16 the enclosure surrounds the system components except for the end walls over which the front cover 14 and the rear cover 15 are mounted. Cable carrier 20 is connected to the chassis by seven bolts, six of which, when partially inserted into the chassis, receive the carrier though the enlarged lower portions of keyed openings 33, 39. Two of these bolts are carried by the flanges 31, 32 and are received in keyed openings 33. Four bolts are carried by the cross wall 38 and are received in the keyed openings 39 in carrier 20 (as seen in FIG. 7). When the cable carrier 20 has been aligned with all the above six bolts by being positioned in the reduced size upper portions of the keyed openings 33, 39, the final bolt is inserted through the circular opening 88 to retain the carrier in the aligned position. The cabling carrier 20 (seen in FIGS. 5, 6 and 7 in more detail) occupies the central portion of the enclosure. Carrier 20 is mounted to enclosure 11 after separate assembly. Having the enclosure frame or chassis 11 and the cabling carrier 20 fabricated and assembled separately reduces the complexity of the system assembly. Each of these subassemblies can be independently fabricated and thereafter merged. This avoids the sequential operations of frame construction followed by the cable assembly into the enclosure interior. The use of the separate cable carrier 20 also facilitates the structure that enables the self docking with its blind connection of power supply and signal connectors and simplifies the task of running the cabling along the same route in each system to prevent changes in phenomena that result from the position of the cables within a system and the electromagnetic compatibility (EMC) characteristics of the system.

The logic cage 35 is received in the upper opening in the rear wall and is connected to power connector 67 and signal connector 52. The AC power supply 27 is received through the lower end wall opening and is self docking with the AC bulk power supply connectors 29. The rear wall lower profile portion 69 of the AC power supply 27 extends beneath the cable carrier 20.

Figure 4:
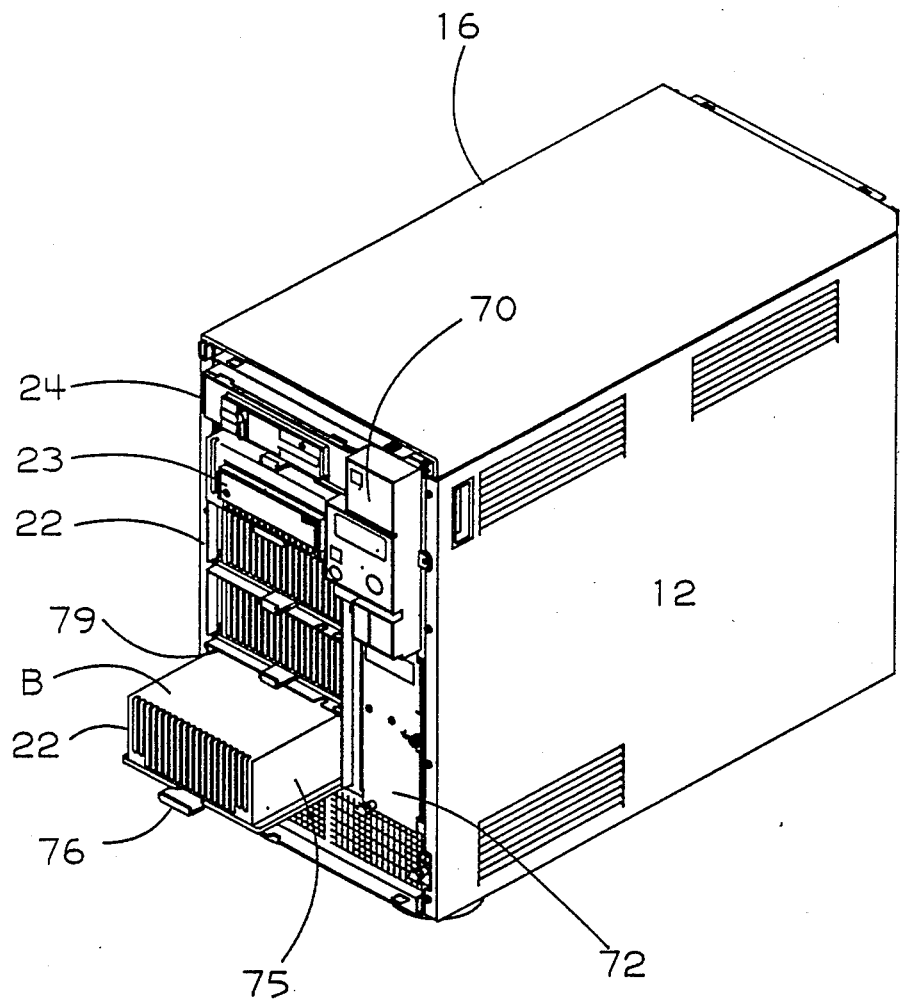
FIG. 4 is an isometric view of the enclosed system of FIG. 1 with the front cover removed and one of the disk drive (DASD) components partially removed.

The view of FIG. 4 includes the front panel area with the front cover 14 removed. With the cover 14 removed, the disk drive (DASD) units 22, tape drive 23, diskette drive 24 and battery backup unit 72 can be slideably mounted or removed. Each of the magnetic storage components is self docking to the cooperating connections in connector blocks 25 (FIG. 7) on the cable carrier 20. As shown, each of the magnetic storage units is contained in a cage 75 which includes a resilient latch at the lower mid portion thereof that is lifted (arrow A) to release the depending latch projection from within an opening in the cross member 79 of the enclosure frame 11. The cage 75 may then be withdrawn along the guideway formed integral with the frame 11. With the front cover assembled, the control panel 70 is exposed and access is provided to the front of tape drive 23 and diskette drive 24 to enable insertion and removal of magnetic storage media.

Figure 5:
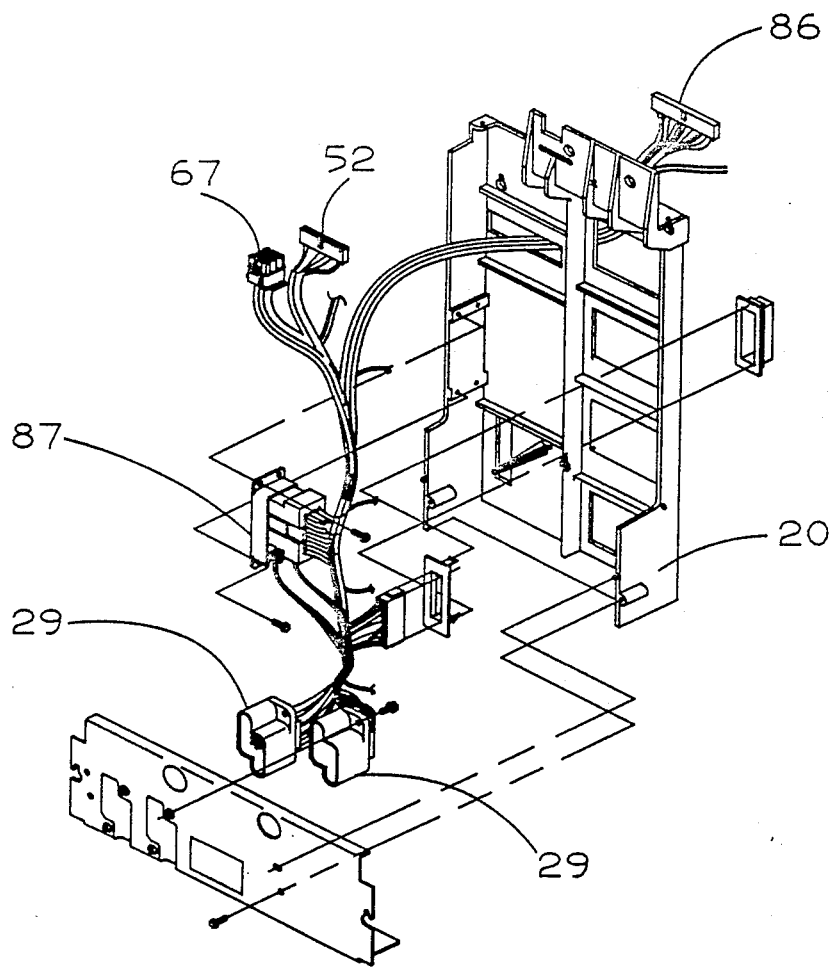
FIG. 5 is an exploded view of the cable carrier assembly showing the power cabling.
Figure 6:
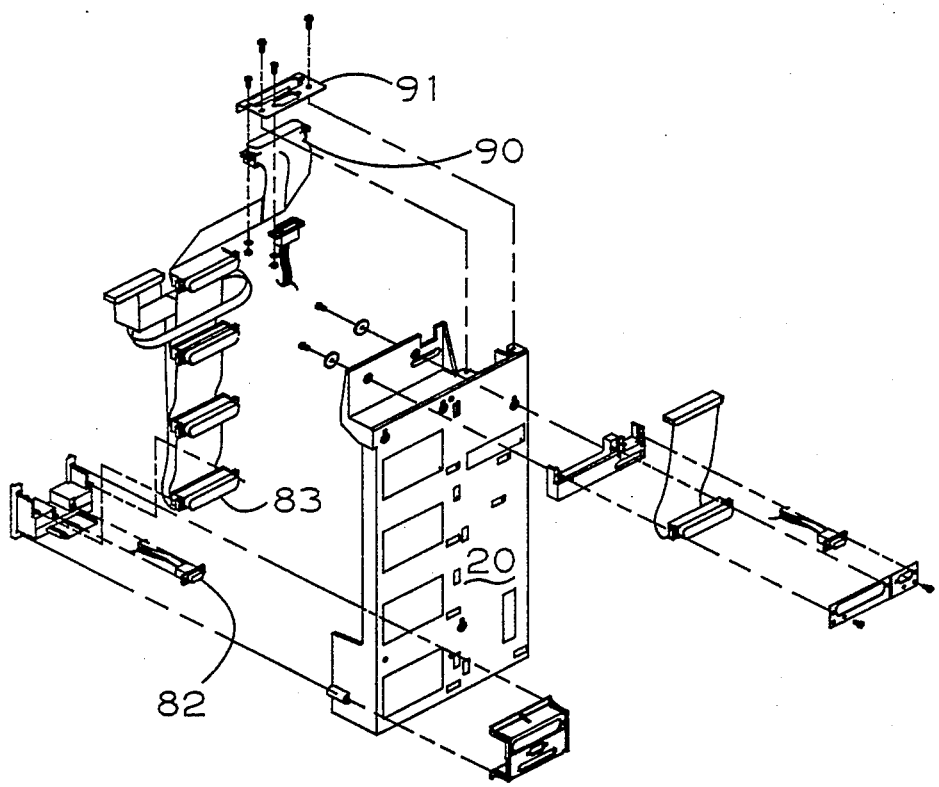
FIG. 6 is an exploded view of the cable carrier assembly showing the signal cabling.
Figure 7A:
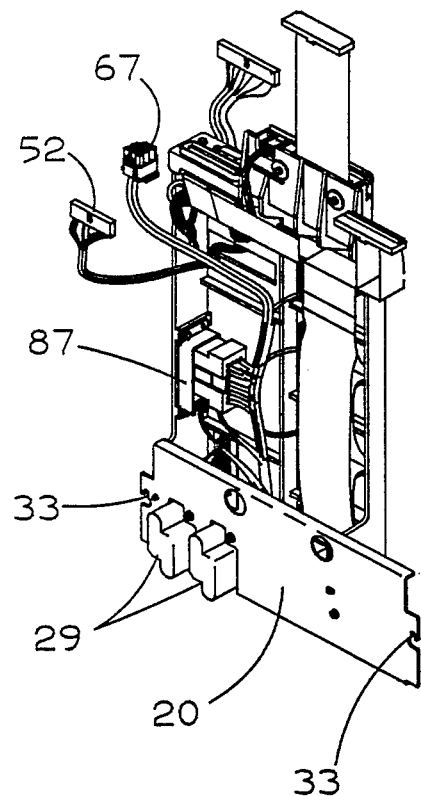
FIG. 7 is a pair of isometric views of the cable carrier assembly showing the cabling and connectors facing in each direction from the carrier to align with the components in each tower or stack confronting the cable carrier.
Figure 7B:
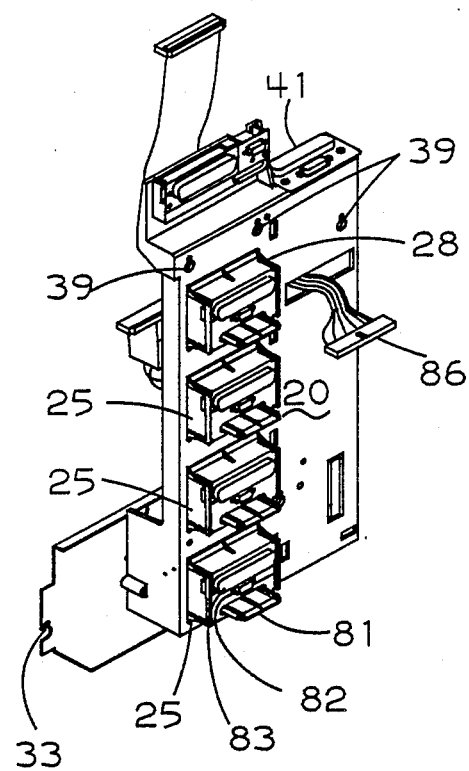

FIGS. 5, 6 and 7 show details of the cable carrier. FIG. 5 illustrates the power cabling, FIG. 6 shows the signal cabling and FIG. 7 includes front and rear views of the carrier with the various connector blocks mounted thereon to present the electrical connectors and some of the alignment structures that assist in the self docking of various components. The cable carrier support structure includes a molded plastic carrier portion 46 and a sheet metal mounting plate 47 which are bolted to one another. Cables extending from the carrier 20 include logic cage power termination 67 and signal termination 52 and the operator panel signal cable termination 86. Mounted on the chassis wall are connector blocks 25 for the DASD units 22, tape drive 23 and diskette drive 24; the AC power supply connectors 29 and the battery backup connector 80. The connector blocks 25 support a tapered aligning projection 81, the floating power connector 82 and the floating signal connector 83. Also carried by the chassis wall is a power distribution connector 87 and, for an external tape unit, power connector 90 and signal connector 91. The cable chassis is independently assembled and thereafter inserted into the enclosure frame through a top opening 65 and bolted to vertical frame members 31, 38 (FIG. 3).

This description of the present invention has been given as an example and it will be understood that various changes in form and details may be made therein without departing from the spirit and scope of the invention.

What is claimed is:

1. A mechanical and electrical packaging structure for a multiple component system wherein such components are disposed in two stacks or towers comprising
   an enclosure frame;
   cable carrier means for electrically interconnecting components in said stacks which is fabricated and merged into said enclosure;
   said cable carrier means carrying electrical connectors and component alignment means facing toward each component stack; and
   means for guiding system components toward a latched, installed position in said enclosure and with said system with the electrical connection being completed at said latched position.

2. The packaging structure for a multiple component system of claim 1 wherein components of said two stacks are mounted through opposite side walls of said enclosure frame toward said central area occupied by said cable chassis.

3. The packaging structure for a multiple component system of claim 2 further comprising means for guiding components to an operative installed position within said enclosure that includes keying means that assure installation at both the correct component location and with the correct orientation.

4. The packaging structure for a multiple component system of claim 3 wherein said system components include logic card carriers, magnetic storage media and power supply means, all of which are self aligned for automatic blind electrical connection when inserted in said guiding means.

5. The packaging structure for a multiple component system of claim 4 wherein said logic card means and said power supply means are mounted under said rear wall cover and said magnetic storage media are installed under said front wall cover, with access openings provided in said front wall cover for insertion and removal of magnetic media with respect to those storage devices having removable media.

6. An equipment enclosure having a tower portion open at one side comprising
   guide means within said tower portion for respectively receiving and guiding a plurality of system components from said one side to an operatively mounted, electrically connected position within said enclosure;
   a cable carrier removably mounted in said enclosure; and
   connector means carried by said cable carrier at the interface with said tower portion,
   said connector means being substantially aligned with the associated component operatively mounted position and including structure tolerant of moderate misalignment to enable self docking of such associated component as it is guided to said operatively mounted position.

7. The equipment enclosure of claim 6 further comprising keying means for assuring component installation at both the correct component location and with the correct orientation.

8. A data processing system within an enclosure wherein the system components are mounted in two vertically aligned stacks comprising
   a cable carrier assembly,
   means for mounting said cable carrier assembly between said two stacks of vertically aligned components,
   connector means at the rear of each component for electrical connection to said cable carrier assembly, and
   means for guiding components of said stacks to an operative electrically connected operating position including aligning means for self docking said components.

9. The data processing system of claim 8 wherein said components and said enclosure include cooperating releasable latch means which are operative to retain the associated component after the electrical connection with the cable carrier assembly has been completed.

10. The data processing system of claim 9 wherein the installation of said components at the operating position within said enclosure and the removal of said components from said enclosure are manual operations accomplished without the use of tools.

11. The method of assembling an enclosed system having electrically interconnected system components within a common enclosure comprising
    separately fabricating an enclosure frame or chassis with openings through opposite end walls and a cable carrier assembly;
    merging said cable carrier assembly and said frame by installing said cable carrier assembly in a central portion of the space enclosed by said frame; and
    slideably inserting said system components on guide means supported by said frame with blind electrical connections automatically completed as said component arrives at the fully inserted, installed position.

12. The method of claim 11 further comprising the step of latching said component at said fully inserted, installed position.

* * * * *